United States Patent
Okada et al.

(10) Patent No.: US 7,662,020 B2
(45) Date of Patent: *Feb. 16, 2010

(54) METHOD FOR MANUFACTURING SURFACE-COATED CUTTING INSERT

(75) Inventors: Yoshikazu Okada, Toride (JP); Takushi Saeki, Kashiwa (JP); Hiroshi Ohmori, Shimotsuma (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/134,443

(22) Filed: Jun. 6, 2008

(65) Prior Publication Data

US 2008/0242200 A1    Oct. 2, 2008

Related U.S. Application Data

(63) Continuation of application No. 11/565,093, filed on Nov. 30, 2006, now Pat. No. 7,393,263.

(30) Foreign Application Priority Data

Dec. 2, 2005    (JP) ............................. 2005-349651

(51) Int. Cl.
    *B24B 49/00*    (2006.01)
(52) U.S. Cl. ............................. 451/2; 451/11; 451/29; 451/38
(58) Field of Classification Search ...... 451/2, 451/11, 29, 38, 39, 40, 82, 102, 379, 398, 451/385
    See application file for complete search history.

(56) References Cited

U.S. PATENT DOCUMENTS

| | | | |
|---|---|---|---|
| 2,092,083 A | 9/1937 | Ogle et al. | |
| 2,272,686 A | 2/1942 | McGibbon | |
| 2,332,095 A | 10/1943 | McGibbon | |
| 5,272,897 A | 12/1993 | Wern | |
| 5,472,330 A | 12/1995 | Oka et al. | |
| 5,709,587 A | 1/1998 | Shaffer | |
| 5,804,009 A | 9/1998 | Dings et al. | |
| 5,861,210 A | 1/1999 | Lenander et al. | |
| 5,980,988 A | 11/1999 | Ljungberg et al. | |
| 6,350,510 B1 | 2/2002 | Konig et al. | |
| 6,422,920 B1 | 7/2002 | Bouten et al. | |

(Continued)

FOREIGN PATENT DOCUMENTS

DE    19719195    11/1998

(Continued)

OTHER PUBLICATIONS

Patent Abstracts of Japan for JP2002-144108 published May 21, 2002.

(Continued)

*Primary Examiner*—Eileen P. Morgan
(74) *Attorney, Agent, or Firm*—Darby & Darby PC (57) ABSTRACT

This method for manufacturing a surface-coated cutting insert includes clamping and holding a surface-coated cutting insert with a pair of rotary shafts which are rotatable around an axis, and jetting an abrasive fluid to the surface of the surface-coated cutting insert using at least one blasting gun while rotating the surface-coated cutting insert, thereby, conducting wet blasting.

13 Claims, 4 Drawing Sheets

U.S. PATENT DOCUMENTS

| | | |
|---|---|---|
| 6,431,954 B1 | 8/2002 | Junker et al. |
| 6,520,838 B1 | 2/2003 | Shaw |
| 7,066,799 B2 | 6/2006 | Oussaada et al. |
| 2002/0039521 A1 | 4/2002 | Votsch et al. |

FOREIGN PATENT DOCUMENTS

| | | |
|---|---|---|
| EP | 0248096 | 12/1987 |
| EP | 0693574 | 1/1996 |
| EP | 1512493 | 3/2005 |
| JP | 58223562 | 12/1983 |
| JP | 63-052970 | 3/1988 |
| JP | 08-052603 A | 2/1996 |
| JP | 2002-144108 A | 5/2002 |

OTHER PUBLICATIONS

Patent Abstracts of Japan for JP08-052603 published Feb. 27, 1996.

METHOD FOR MANUFACTURING SURFACE-COATED CUTTING INSERT

BACKGROUND OF THE INVENTION

1. Field of the Invention

The present invention relates to a method for manufacturing a surface-coated cutting insert which is mounted to various insert-removable machine tools and is used for metal cutting.

This application claims priority from Japanese Patent Application No. 2005-349651 filed on Dec. 2, 2005, the content of which is incorporated herein by reference.

2. Background Art

A cutting insert has an insert body with a hard material, such as tungsten carbide-based cemented carbide, titanium carbonitride-based cermet or ceramics, and the like as the substrate (e.g., in the shape of a polygonal plate), in which a cutting edge is formed at the intersecting edge line region of its rake face and flank face, and the cutting insert is mounted to insert-removable machine tools and has been widely used for metal cutting. As for such cutting inserts, surface-coated cutting inserts coated with a coating layer which is formed into a single layer or two or more layers with carbide, nitride, oxide, boride of one selected from Groups IVa, Va, VIa metals of the periodic table of elements, Al and Si, or their composite compounds on the surface of the insert body have also been proposed for mainly improving their wear resistance.

As such surface-coated cutting inserts, an insert in which a portion of the coating layer is mechanically removed or the surface of the coating layer is smoothened has also been proposed. For example, it has been disclosed in Patent Document 1 that a $TiC_xN_yO_z$ layer formed on an $\alpha$-$Al_2O_3$ layer is mechanically removed from only the cutting edge line or from both of the rake face and the cutting edge line, and the $TiC_xN_yO_z$ layer remains on the flank face. It has also been disclosed that $Al_2O_3$ having strong resistance to diffusion-type crater wear or welding (smearing) is used for the outermost layer of the rake face and the cutting edge, and a $TiC_x$-$N_yO_z$ having strong resistance to flank wear is used for the outermost layer of the flank face in place of $Al_2O_3$ which is worn out in a relatively early stage; thereby, excellent wear resistance is simultaneously displayed at the rake face and the flank face. Moreover, brushing, polishing, or dry and wet blasting treatment are given as forms of mechanical removal.

In Patent Document 2, it has been shown that a wear-indicating layer is provided on the flank face so as to enable simply detecting whether the cutting edge is unused or used. It also shows a method in which an $Al_2O_3$ layer is desirably coated as an wear reducing coating and then a TiN layer is coated as an outermost layer, subsequently the TiN layer which is a wear-indicating layer is mechanically removed by a brush or a sandblast from the rake face and the cutting edge.

In such mechanical removal of the coating layers described in Patent Documents 1 and 2, the brushing using a brush or the polishing treatment is carried out wherein the surface of a cutting insert is polished with a nylon brush containing, for example, abrasive grains, a brush of animal bristle added with diamond paste or an elastic grindstone, and the like However, such treatment is high working energy treatment that is also applied to a honing treatment and a lapping treatment of cutting edges in a normal cutting insert. Moreover, it is feared that because the working energy strongly acts on the above-described intersecting edge line region where the cutting edge especially protruding from the insert body is formed, the treatment could not stop with the removal of the outermost $TiC_xN_yO_z$ layer or TiN layer in that intersecting edge line region and the $Al_2O_3$ layer under the layers is also ground and thinned locally. In the blasting treatment such as dry sandblast, and the like, it is also feared that the working energy still increases, consequently grinding scratches and the like are generated at the surface of the $Al_2O_3$ layer exposed by removing the outermost layer, particularly, the surface roughness is deteriorated or the reduction of toughness of the insert itself is brought about.

In the above-mentioned brushing and polishing using the brush or the elastic grindstone, the cutting insert can be treated only one side by one side. It is unavoidable to lower the treatment efficiency for a negative type cutting insert and the like in which edges are formed at both of the top face and the bottom face of a plate insert body. Even in the dry or wet blasting treatment using sandblasting, for example, if the blasting treatment is applied on condition that a cutting insert is fit into a hole formed in a jig of rigid urethane and the like or a pin provided on a jig is inserted into a mounting hole of the cutting insert so as to set the cutting insert on the jig, the treatment still can be made only one side by one side, and in addition if the jetting direction of abrasive material of the sandblast is in one direction, the whole periphery of the cutting insert is not uniformly treated, thus a cutting insert with a partially different state of cutting edge or rake face is manufactured.

The present invention was made under such a background and its purpose is to provide a method for manufacturing a surface-coated cutting insert which does not remove a coating layer more than necessary or does not deteriorate the surface roughness and is capable of making a uniform and efficient treatment when the cutting insert formed with the coating layer at the surface of the insert body is subjected to a treatment of removing a portion of the coating layer or smoothening the surface.

(Patent Document 1) Japanese Patent Application, First Publication No. H8-52603

(Patent Document 2) Japanese Patent Application, First Publication No. 2002-144108

SUMMARY OF THE INVENTION

The method for manufacturing a surface-coated cutting insert of the present invention includes clamping and holding a surface-coated cutting insert with a pair of rotary shafts which are rotatable around an axis, and jetting an abrasive fluid to the surface of the surface-coated cutting insert using at least one blasting gun while rotating the surface-coated cutting insert, thereby, conducting wet blasting.

The surface-coated cutting insert may be clamped and held such that a rake face thereof is perpendicular to the axis and facing the direction of the axis.

The rotational time and/or the rotational velocity of the rotary shafts may be controlled while conducting the wet blasting by the blasting gun.

The rotation of the rotary shafts may be controlled in one or a plurality of rotary angle regions or at one or a plurality of rotary angle positions while the rotary shafts make one revolution around the axis.

The rotational velocity of the rotary shafts may be changed in one or a plurality of the rotary angle regions while the rotary shafts make one revolution around the axis.

The rotation of the rotary shafts may be stopped at one or a plurality of the rotary angle positions while the rotary shafts make one revolution around the axis.

The jetting pressure of the abrasive fluid by the blasting gun may be controlled in one or a plurality of rotary angle regions or at one or a plurality of rotary angle positions while the rotary shafts make one revolution around the axis.

The rotational velocity of the rotary shafts may be changed in one or a plurality of the rotary angle regions.

The rotation of the rotary shafts may be stopped at one or a plurality of the rotary angle positions.

The jetting angle made by the jetting direction of the abrasive fluid from the blasting gun and the axis may be adjustable.

The wet blasting may be conducted while a masking member is mounted to at least one of the pair of the rotary shafts and the surface of the surface-coated cutting insert is masked.

The wet blasting may be conducted using a plurality of the blasting guns.

A plurality of the blasting guns may be located on the opposite sides by interposing the axis of the rotary shafts, and the blasting guns may be disposed such that the nozzles thereof face towards the surface-coated cutting insert which is held by the rotary shafts.

A plurality of the blasting guns may be located on the opposite sides in the direction of the axis by interposing a portion between the pair of rotary shafts.

The surface-coated cutting insert may be formed in the shape of a polygonal plate.

A substrate of the surface-coated cutting insert may be tungsten carbide-based cemented carbide, titanium carbonitride-based cermet, or ceramics.

In the present invention, the wet blasting treatment applied to the surface-coated cutting insert is a treatment in which an abrasive fluid of a liquid (generally water) containing abrasive materials is jetted to an object to be treated so as to conduct the abrasion. As compared with a mechanical grinding using an elastic grindstone or a brush or a dry blasting treatment such as sandblasting, it becomes a soft processing with a moderated working energy because the kinetic energy of the abrasive material is attenuated by the liquid in a space between the abrasive and the object to be treated. Therefore, the excessive removal of a coating layer more than necessary to locally thin the coating layer and the deterioration of surface roughness can be prevented when it is used for partial removal of the coating layer and surface smoothening of such a surface-coated cutting insert like the present invention. Particularly, the local working energy does not strongly act on the above-described intersecting edge line region, therefore the intersecting edge line region where a cutting edge is formed is not over-treated.

Furthermore, in the manufacturing method of the present invention, abrasive fluid is jetted to the surface of a surface-coated cutting insert by blasting guns to conduct the wet blasting while holding the surface-coated cutting insert by a pair of rotary shafts which is able to rotate around the axis and rotating the cutting insert by these rotary shafts. This enables applying a uniform treatment over the whole periphery of the cutting insert. Moreover, by providing blasting guns on the both sides of the cutting insert in the direction of above-described axis, the treatment of both sides can be conducted simultaneously and efficiently even for a negative type cutting insert where cutting edges are formed on both of the top face and the bottom face of the insert body. Furthermore, as compared with a case where an insert is set in a jig having, for example, the above-mentioned hole or pin, the automation is easy and the automation of blasting treatment is also possible by clamping and holding the cutting insert with the rotary shafts in this manner. Therefore, surface-coated cutting inserts with stabilized quality can be economically manufactured by mass production.

Here, if the jetting pressure of the abrasive fluid from the above-described blasting guns, the content of the abrasive material in the abrasive fluid, and the distance between the cutting insert and the blasting guns are constant, the treated quantity (ground quantity) of portions of the cutting insert due to the wet blasting is affected by the time of receiving the wet blasting, i.e., the rotational time and the number of rotating the cutting insert around the axis, i.e., the rotational velocity. It is feared that the treated quantity reduces and a sufficient surface smoothening cannot be achieved if the rotational time is too short, while the coating layer is removed more than necessary if it is too long. It is also feared that a sufficient smoothening still becomes difficult if the rotational velocity of the rotary shafts, i.e., the rotational velocity of the cutting insert at the time of receiving this wet blasting treatment is too high. On the other hand, it is feared that the portions are intensively treated and the coating layer is locally thinned for wet blasting if the rotational velocity is too low. Accordingly, for the cutting insert that is thus held on the rotary shafts and rotated, it is desirable to control the rotational time and the rotational velocity at the time of conducting the wet blasting by the above blasting guns so as to achieve a more reliable and uniform treatment.

The cutting insert as described above is generally formed in the shape of a polygonal plate and the like except for a disk-like insert. Accordingly, even if the distance between the blasting guns and the axis of the rotary shafts is constant, the distance between the coating layer of the surface of the insert body applied with the wet blasting and the blasting guns changes with the rotation; therefore, a difference in treated quantity received among the portions on the insert occurs. On the other hand, in the cutting insert of such a shape of polygonal plate, when side edge portions of polygonal faces are used as cutting edges, only limited portions at or in the vicinity of angular portions of these polygonal faces becomes cutting edges actually involved in the cutting operation in these cutting edges in many cases. Accordingly, sometimes it is desired to apply a concentrated treatment to, at these angular portions, i.e., corner sides, the cutting edges and the rake face or the flank face linking with the intersecting edge line regions where these cutting edges are formed, and to inhibit the treatment in other portions so as to achieve a good efficiency.

Accordingly, even in such a cutting insert in the shape of a polygonal plate, in the case in which a more reliable and uniform treatment over the whole periphery of cutting insert is achieved by promoting a treatment of portions that are hard to be treated because the distance is away with the rotation and inhibiting a treatment of portions that are easy to be treated because the distance is near, or in the case in which an even higher efficiency is achieved by promoting a concentrated treatment in the above-described corner portions and inhibiting a treatment in other portions, it is desired that the rotational velocity of the rotary shafts is changed in one or a plurality of rotary angle regions while the above rotary shafts makes one revolution around the above axis.

Namely, in the rotary angle regions of the rotary shafts when portions that become hard to be treated because the distance is away and portions to be intensively treated are located opposite to the blasting guns, a sufficient wet blasting can be applied to the above-described portions by reducing the rotational velocity of these rotary shafts. Conversely, the treatment may be inhibited by accelerating the rotational velocity in the rotary angle regions of the rotary shafts when portions that are easy to be treated or portions to be simply treated are located opposite to the blasting guns. Particularly, by stopping the rotation of the rotary shafts at these rotary angle positions while the above rotary shafts make one revolution around the above axis, a more reliable and sufficient wet blasting treatment can be applied to the portions opposite to the blasting guns at one or a plurality of rotary angle positions.

On the other hand, for example, when the wet blasting treatment is mainly applied to the flank face of the cutting insert in the shape of a polygonal plate as described above, the jetting direction of an abrasive fluid given by the blasting guns is set up such that the jetting angle relative to the axis is 90°. When the wet blasting treatment is mainly applied to the rake face formed on the polygonal faces, this jetting angle is set to 0°. When the treatment is applied to both of the rake face and the flank face, the jetting angle is set to an acute angle. Therefore, if this jetting angle is adjustable, a suitable jetting direction can be set up in accordance with portions to which the treatment is applied.

When the $TiC_xN_yO_z$ layer formed on the $Al_2O_3$ layer as described in Patent Document 1 is removed from a cutting edge line only, it is desirable to apply masking onto the coating layer of the cutting insert surface so that the coating layer is not removed from portions other than this cutting edge line. In such a case, because the surface-coated cutting insert is clamped by a pair of rotary shafts in the manufacturing method of the present invention, by mounting a masking member to at least one of this pair of the rotary shafts, it has only to hold this surface-coated cutting insert with the pair of rotary shafts so as to conduct wet blasting while masking the surface of the surface-coated cutting insert. Therefore, as compared with a case in which the masking treatment is applied to the one by one surface of the surface-coated cutting inserts to be treated, operations can be greatly simplified, even if the surface-coated cutting inserts applied with such wet blasting treatment are mass produced, they can be easily treated.

PREFERRED EMBODIMENTS

Figure 1:
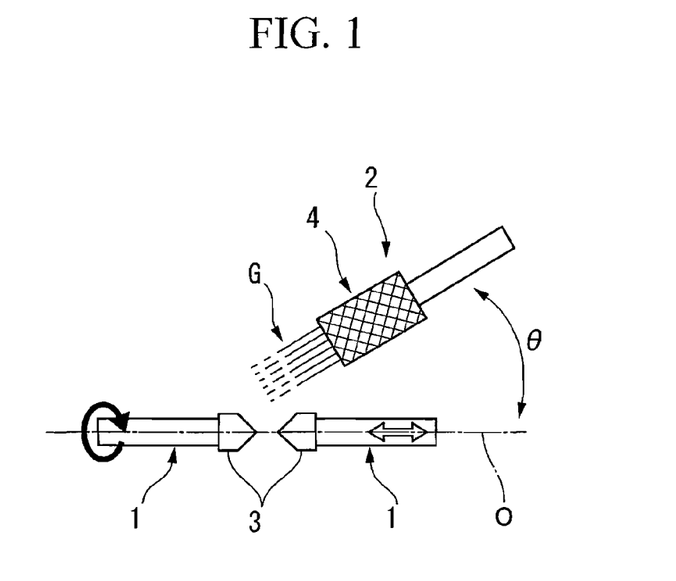
FIG. 1 is a diagram showing a manufacturing equipment relating to an embodiment (Embodiment 1) of the present invention.
Figure 2:
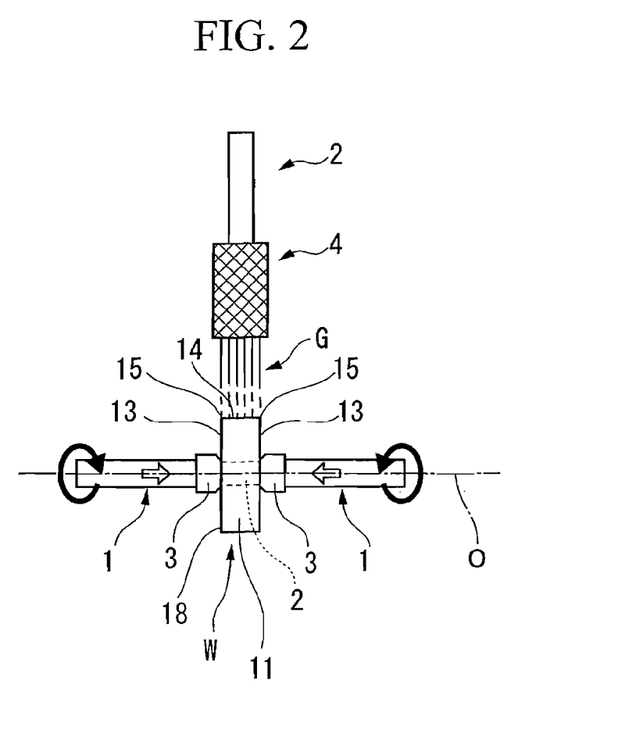
FIG. 2 is a diagram describing an embodiment of the present invention in which wet blasting treatment is conducted so as to manufacture a surface-coated cutting insert W using the manufacturing equipment shown in FIG. 1.

FIG. 1 shows an example of the equipment for manufacturing a surface-coated cutting insert relating to an embodiment (Embodiment 1) of the present invention, and FIG. 2 shows an embodiment of the present invention using this manufacturing equipment.

In the manufacturing equipment of FIG. 1, a pair of rotary shafts 1 are located with a spacing therebetween such that their front ends face each other, and are supported coaxially and rotatably in the same direction around an axis extending for example horizontally, and a blasting gun 2 for conducting the wet blasting by jetting an abrasive fluid G to the surface of a surface-coated cutting insert W held between these rotary shafts 1 as shown in FIG. 2 is provided on a side (upper side in FIG. 1) of this axis O.

Figure 3:
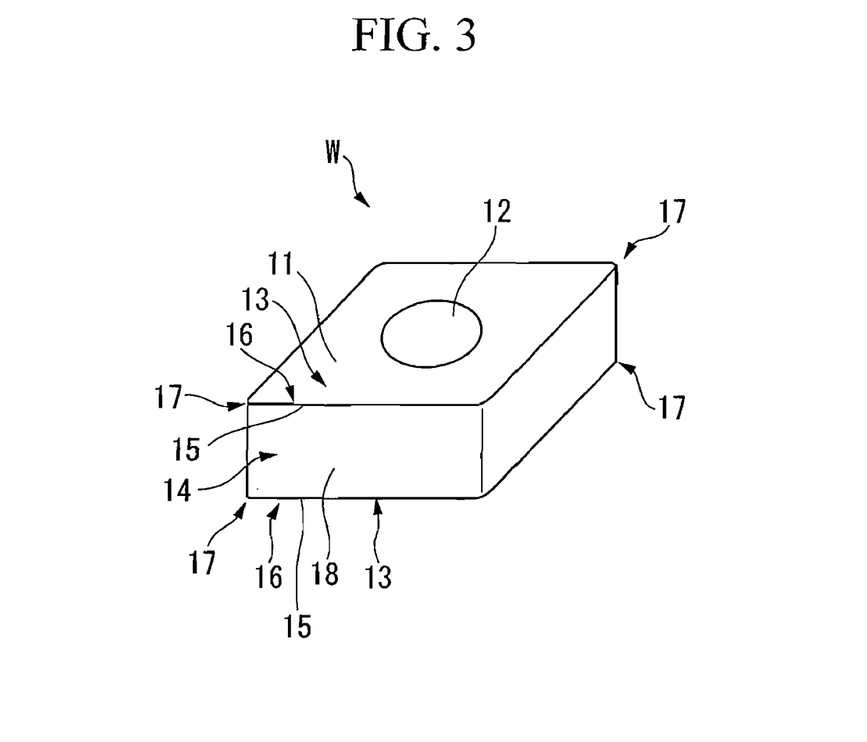
FIG. 3 is an oblique view showing a example of the surface-coated cutting insert W subjected to the wet blasting treatment in the embodiment of FIG. 2.

Here, an insert body 11 of the surface-coated cutting insert W which is subjected to the wet blasting treatment in this embodiment is formed in the shape of a polygonal plate (the shape of a rhombic plate in FIG. 3) with tungsten carbide-based cemented carbide, titanium carbonitride-based cermet or ceramics as a substrate as shown in FIG. 3. Namely, its surface has a pair of polygonal faces parallel to each other and a plurality of lateral faces arranged around these polygonal faces and extending in the thickness direction (the up-down direction in FIG. 3) of this insert body 11. A mounting hole 12 for mounting the insert body 11 to a mounting seat of an insert-removable machine tool is formed such that the mounting hole 12 passes through the insert body 11 at the center of the polygonal faces.

Then, rake faces 13 are formed at the polygonal faces of the insert body 11 and flank face 14 is formed at the lateral face, and cutting edges 16 are formed at the intersecting edge line regions 15 of the rake faces 13 and the flank faces 14, i.e., the side edge portions of above polygonal faces. However, in the cutting insert having the insert body 11 in the shape of a polygonal plate as described above, it is rare to use all side edge portions of the polygonal faces as cutting edges 16, particularly, in the cutting insert in the shape of rhombic plate, edges on the corner 17 sides making an acute angle in its rhombic faces are exclusively used as the cutting edges 16.

Moreover, the above-described surface-coated cutting insert is used as a negative type insert in which a pair of polygonal faces forming the rake faces 13 and four lateral faces forming the flank faces 14 extend in a direction perpendicularly crossing with each other via the intersecting edge line regions 15. Accordingly, the cutting edges 16 are formed at eight side edge portions of a top side and a bottom side interposing the corner portions 17, the cutting edges 16 can be used well by rotating the insert body 11 at 180° around the mounting hole 12, or turning from the top side to the bottom side. Furthermore, honing such as circular honing and the like may also be applied to the intersecting edge line regions 15 at which the cutting edges 16 are formed.

A coating layer is formed on the substrate as described above at the surface of the insert body 11. This coating layer 18 is formed in a single layer or a multilayer of two or more layers, for example, with carbide, nitride, oxide, boride of one selected from Group IVa, Va, VIa metals of the periodic table of elements, Al, and Si or a composite compound thereof and covers the entire surface of the insert body 11. However, when this coating layer 18 has layers of carbide, nitride, oxide, boride of one selected from Group IVa, Va, VIa metals of the periodic table of elements, Al, and Si or a composite compound thereof, it is desirable that Group IVa, Va, VIa metals of the periodic table of elements are selected from Ti, Zr, Hf, and Cr.

Such a coating layer 18 can be formed by well-known chemical vapor deposition (CVD) method or physical vapor deposition (PVD) method; however, it is more desirably formed by the chemical vapor deposition method which is coated at high temperatures and is used in a high-load and high-efficiency operation. The surface of the substrate of the insert body 11 to be covered may be ground, or it may also be an as-sintered surface, so-called M-grade accuracy.

The manufacturing equipment for subjecting the wet blasting treatment to the surface-coated cutting insert W is used for the cutting insert W having the mounting hole 12 in the insert body 11 as described above, caps 3 made of an elastic material such as a hard urethane rubber and the like that are made in the shape of a cone with a fine tip faced to its front end are mounted to the front end of above rotary shafts, respectively. At least one of the pair of the rotary shafts can go forward and backward in the direction of the axis O, the thickness direction of the insert body 11 is in conformity to the direction of this axis O and the cutting insert W is arranged between the two rotary shafts 1, the caps 3 are closely adhered to the opening of the mounting hole 12, then by advancing at least one of the rotary shafts 1 to the other, the cutting insert W can be held and rotated integrally with the rotary shafts 1. Accordingly, in the surface-coated cutting insert W thus held, the rake faces 13 are perpendicular to the axis O and faces towards the direction of this axis O and the flank faces 14 is parallel to the axis O as shown in FIG. 2.

On the other hand, the blasting gun 2 jets the abrasive fluid G in which abrasive is mixed with a liquid from a nozzle 4 of its front end to the surface-coated cutting insert W clamped and held between the above rotary shafts 1 by a pressure of compressed air so as to conduct the wet blast. Water is commonly used as the liquid of the abrasive fluid G, and various hard abrasive such as alumina, zirconia, resins-based abrasive, glass-based abrasive, and the like are usable as the fine abrasive of about 10 to 500 μm, especially about 10 to 200 μm in particle diameter are preferable. The content of the abrasive in the abrasive fluid G is, for example, 15 to 60 wt % in case of using alumina as the abrasive, and the pressure of the compressed air is preferably within a range of 0.05 to 0.3 MPa.

The jetting angle θ of the abrasive fluid G of this blasting gun 2 to the above axis, i.e., an angle made by the jetting direction of the abrasive fluid G from the nozzle 4 with the axis O can be adjusted within a range of 0 to 90°. Accordingly, for the surface-coated cutting insert W in which the rake faces 13 face towards the direction of the axis O as described above, the jetting angle θ is 0 to 90° relative to the axis O. Namely, the jetting direction of the abrasive fluid G can be set up from a direction which is parallel to the axis O and the flank face 14 and is opposite to the rake faces 13 at the jetting angle θ of 0° as described later to a direction which is perpendicular to the axis O and the flank faces 14 and is opposite to the flank face 14 at the jetting angle θ of 90° as shown in FIG. 2. The abrasive fluid G is jetted in parallel along the directions of the jetting angles from the nozzle 4 in the illustrated example, but the abrasive fluid G may also be jetted in the shape of cone with a straight line extending in the direction of the jetting angle θ as center.

A rotary drive device rotating the rotary shafts 1 around the axis O can be properly controlled by a non-illustrated control device. For example, the rotational time of the rotary shafts 1, i.e., the time in which the surface-coated cutting insert W is subjected to the wet blasting treatment and the number of rotating the rotary shafts 1, i.e., the rotational velocity of surface-coated cutting insert W are controlled in the control device. It may also control such that the rotational velocity of the rotary shafts 1 is changed intermittently or continuously in pre-set one or a plurality of rotary angle regions or the rotation of the rotary shafts 1 and the surface-coated cutting insert W is stopped for a prescribed time at pre-set one or a plurality of rotary angle positions, corresponding to positions where the surface of the surface-coated cutting insert W is subjected to the jetting of the abrasive fluid G from the blasting gun 2 while the rotary shafts 1 make one revolution, i.e., the cutting insert W makes one revolution around the axis O. The jetting of the abrasive fluid G from the blasting gun 2 is also controlled by the control device so as to start or stop the jetting of the abrasive fluid G, or change the jetting pressure of the abrasive fluid G intermittently or continuously when the rotary shafts 1 and the cutting insert W are positioned in the prescribed rotary angle regions or prescribed rotary angle positions as described above.

In the manufacturing method of this embodiment using this manufacturing equipment, the jetting angle θ of the blasting gun 2 is set to 90° as shown in FIG. 2; therefore, the abrasive fluid G is jetted towards this flank face 14 from a direction perpendicular to the thickness direction and the axis O towards the flank face 14 of the surface-coated cutting insert W. Accordingly, if the wet blasting is applied by the blasting gun 2 while the surface-coated cutting insert W is held and rotated between the pair of rotary shafts 1 as described above, the coating layer 18 covered on the flank face 14 at the surface of the insert body 11 is mainly treated to be ground and smoothened and, if necessary, removed in this embodiment, and for example, the treatment is also applied to a portion on the flank face 14 side at the intersecting edge line region of the flank face 14 and the rake face 13.

As compared with a mechanical processing with an elastic grindstone or a brush and also as compared with a dry blast treatment like sandblast, the kinetic energy of the abrasive is attenuated by the liquid of the abrasive fluid G to become a soft processing with a moderated working energy because this wet blasting treatment jets the abrasive fluid G that is a liquid containing the abrasive to the cutting insert W so as to conduct a treatment such as grinding and the like of its surface as described above. Accordingly, the removal of the coating layer 18 too much to be locally thinned more than necessary by the treatment, the occurrence of grinding scratches, and the deterioration of surface roughness can be prevented. Particularly, because a strong working energy does not locally act at the intersecting edge line regions 15, there is no overtreatment of only these intersecting edge line regions 15 where the edges 16 are formed.

When the wet blasting treatment is applied as described above, the wet blasting is conducted while clamping and holding the cutting insert W by a pair of the rotary shafts 1 rotatable around the axis O and rotating the cutting insert W by these rotary shafts 1. Accordingly, a uniform treatment free of irregularities over the whole periphery of the cutting insert W can be conducted as compared with a case of applying the treatment to the cutting insert W from one direction. Moreover, as compared with a case of setting the cutting insert W in a jig having the above-described hole and pin, by a constitution for clamping and holding the insert with the rotary shafts 1, for example, the surface-coated cutting insert W applied with such a treatment can be mass produced and economically manufactured with a stabilized quality in combination with easy automation as well as possible automation of blasting treatment because the cutting insert W can be held by the above-described forward and backward movement of rotary shafts 1.

On the other hand, in this embodiment, the rotational time of the rotary shafts 1 at the time of conducting the wet blasting with the above-described blasting gun is controlled by the above-described control device. Accordingly, it may be prevented that the rotational time, i.e., the treatment time is too short and a sufficient surface smoothening and the like cannot be achieved or, conversely, the rotational time is too long and the coating film is carelessly removed more than necessary by subjecting to the blast. In conformity thereto, the rotational velocity of the rotary shafts 1, i.e., the rotational velocity of the treated cutting insert W is also controlled by the control device. Therefore, insufficient surface smoothing due to the fact that the rotational velocity is too fast and conversely, the locally thinning of the coating film 18 due to the fact that the rotational velocity is too slow and the portions of cutting insert W is intensively treated, can be prevented, accordingly a more reliable and very uniform treatment can be realized.

For the cutting insert W in the shape of a polygonal plate, like the above-described rhombic plate, applied with the blast treatment in this embodiment, even if the position of the blasting gun 2 is fixed to make the distance from the axis O of the rotary shafts 1 to the blasting gun 2 constant, the distance between the coating layer 18 of its surface and the nozzle 4 of the front end of the blasting gun 2 changes with the rotation. Therefore, a difference in the treated quantity received by the portions of the cutting insert W due to the wet blasting occurs. For example, at the acute corners 17 of the rhombic faces, the distance from the central line of the mounting hole 12 which is the center of the cutting insert W becomes long. Therefore, the distance from the axis O of the rotary shafts 1 coaxial with the central line also lengthens, the distance from the nozzle 4 at the time when this corner 17 faces to the nozzle 4 of the blasting gun 2 becomes shorter than other portions of the cutting insert W. Consequently, the treated quantity increases because the abrasive fluid G is jetted strongly. Conversely, the treated quantity reduces at obtuse corners which are in a short distance from the central line and portions which come into contact with an inscribed circle with the central line as a center at the lateral face of the insert body 11.

Accordingly, even in such a case, in order to apply a uniform treatment over the whole periphery of the surface-coated cutting insert W, the rotational velocity of rotary shafts 1 is also changed in one or a plurality of rotary angle regions while the rotary shafts 1 make one revolution around the axis O as described above by the control device. Then, the rotational velocity is relatively accelerated to inhibit the treated quantity at a rotary angle region that the acute corner 17 is faced to the blasting gun 2 side, while the rotational velocity may relatively be decelerated at a rotary angle region that the obtuse corners and the above-described portions of the lateral face coming into contact with an inscribed circle are faced to the blasting gun 2 side so as to ensure a sufficient treated quantity. Particularly, the rotation of these rotary shafts 1 may be controlled such that it is stopped for only a prescribed time so as to ensure a necessary treated quantity in such one or a plurality of rotary angle positions at which these portions are faced to the blasting gun 2 while the rotary shafts 1 make one revolution around the axis O in order to reliably ensure the treated quantity in such portions where the treated quantity reduces.

On the other hand, in such a cutting insert W in the shape of a polygonal plate, a cutting edge actually involved in cutting operation in the cutting edges 16 formed at the side edge portions of the polygonal faces as described above is within a limited range on the corners of these polygonal faces, especially the above-described acute corner 17 side in many cases. Accordingly, conversely to the above-described control method, there also occurs a need to apply a concentrated treatment to the cutting edges 16 at the periphery of the corners 17 which are involved in this cutting operation and the rake face or the flank face linking at the intersecting edge line regions where these cutting edges are formed so as to ensure a sufficient treated quantity according to circumstances. It is also desired that a high efficiency of the wet blasting treatment is conducted by inhibiting the treated quantity in the obtuse corners and the portions coming into contact with an inscribed circle except for the portions involved in such cutting operation.

Accordingly, in such a case, even if the rotational velocity of these rotary shafts 1 is changed in one or a plurality of rotary angle regions while the above rotary shafts 1 make one revolution around the axis O by the control device, conversely to the above-described case, the rotational velocity is controlled such that it relatively decelerated or the rotation is stopped for a prescribed time to ensure the treated quantity in such rotary angle regions or rotary angle positions at which the acute corners 17 are faced to the blasting gun 2 side while the rotational velocity is relatively accelerated in such rotary angle regions at which the obtuse corner portions and the portions coming into contact with an inscribed circle are faced to the blasting gun 2 side. Moreover, in the cutting insert W in the shape of a rhombic plate like this embodiment, two by two acute corners are formed in a top-bottom symmetrical way, therefore the above rotary angle regions or rotary angle positions are two places, then the number of these rotary angle regions or rotary angle positions is properly set to be one or plural in accordance with the shape of cutting insert W or the required treatment.

Further, the treated quantity in the portions of cutting insert W may be adjusted by controlling the jetting of the abrasive fluid G in a combination of controlling the rotational time and the rotational velocity of rotary shafts 1, changing the rotational velocity of the rotary shafts 1 in pre-set rotary angle regions or stopping the rotary shafts 1. It may also be adjusted solely by the control device. Namely, the wet blasting is applied at a relatively high pressure in the rotary angle regions or rotary angle positions of rotary shafts 1 where the portions whose treated quantity is to be increased is faced to the blasting gun 2 side, while the wet blasting is applied at a relatively low pressure in the rotary angle regions or rotary angle positions of rotary shafts 1 where the portions whose treated quantity is to be inhibited is faced to the blasting gun 2 side. It gives the same effects as the case of controlling, changing the rotational time or rotational velocity or stopping the rotation.

Of course, the wet blasting is more effective if these controls are combined.

The above jetting angle $\theta$ relative to the axis O is 90° in this embodiment and the wet blasting treatment is applied to the flank face 14 and the flank face 14 side portion at the intersecting edge line regions 15, therefore the surface smoothening of this flank face 14 can be realized. Accordingly, when the surface-coated cutting insert W manufactured by applying the treatment in this way is mounted to, for example, a mounting seat formed on the body of an insert-removable machine tool, the positioning accuracy at the time of bringing the flank face on one acute corner 17 side into touch with the wall of the mounting seat for supplying the cutting edges 16 on the other acute corners 17 side to the cutting operation may be improved and the repeatability of position of the cutting edges 16 at the time of inverting the cutting insert W to exchange the corners 17 is also good, therefore an improvement of working accuracy given by the cutting insert W can be realized.

On the other hand, according to this embodiment, the coating layer 18 formed at the surface as described above may be remained as it is because a portion of the cutting insert W on the rake faces 13 side is rarely affected by the treatment based on the wet blasting. The coating layer 18 formed as described above can be prepared so as to present a bright tone such as yellow, cream, gold, white system, and the like, therefore, if chips rub the rake face 13 and wear the coating layer 18 during cutting or the coating layer 18 discolors due to friction heat generated by this rubbing, it may be easily confirmed even on the operational sites of cutting operation with insufficient lighting. Therefore, the use or non-use of the cutting edge 16 can be reliably identified, the reuse of used cutting edges 16, or conversely the discard of cutting insert W with unused edges 16 as they are remaining can be prevented. In this embodiment, the flank face 14 where the treatment of the cutting insert W is applied is also made a round by making the rotary shafts 1 a round, therefore an advantage that the treatment with one blasting gun 2 is possible as shown in FIG. 2 is also obtained. However, two or more blasting guns 2 may be arranged to improve the efficiency.

In this embodiment, the wet blasting treatment is mainly applied to the flank face 14 of the cutting insert W by one blasting gun 2 with the jetting angle of 90°. However, the wet blasting treatment of the rake faces 13 formed at the polygonal faces of the cutting insert and portions on the rake face 13 side at the intersecting edge line regions 15 may also be conducted by adjusting this jetting angle θ and setting it to 0°, i.e., setting it such that the axis O of the rotary shafts 1 and the jetting direction of the abrasive fluid G from the blasting gun 2 are parallel like Embodiment 2 shown in FIG. 4. In the manufacturing equipment relating to this embodiment, a plurality of (two in this embodiment) blasting guns 2 are located on the opposite sides by interposing the axis O of the rotary shafts 1, and are also located on the opposite sides in the direction of the axis O by interposing a portion between a pair of the rotary shafts 1 holding the cutting insert W. Namely, they are located on the opposite sides in the thickness direction of the held cutting insert W, and the nozzles 4 are arranged so as to face to this cutting insert W, respectively.

Figure 4:
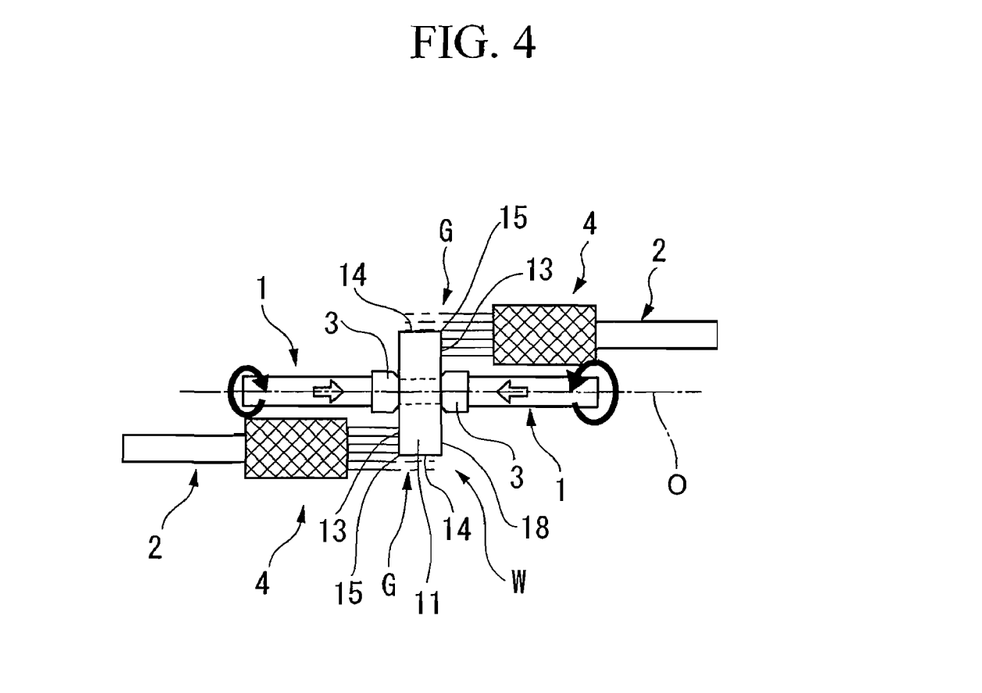
FIG. 4 is a diagram describing Embodiment 2 of the manufacturing method of the present invention.

In the embodiment based on such a manufacturing equipment, the rake faces 13 formed at the polygonal faces of the insert body 11 and a portion continuing at the intersecting edge line region 15 on the rake face 13 side can be mainly treated in the surface-coated cutting insert W formed with the coating layer 18. Accordingly, this embodiment may provide a cutting insert W capable of reducing the friction with chips rubbing on this rake face 13 to inhibit the cutting resistance because smoothing of rake faces 13 of the manufactured cutting insert W can be realized. Moreover, the wet blasting treatment may be simultaneously applied to both of the top face and the bottom face of polygonal faces of the insert body 11 while the cutting insert W rotates with the rotary shafts 1 because a plurality of the blasting guns 2 are located and arranged on opposite sides in the thickness direction of the cutting insert W in this embodiment, thus it enables to conduct an effective treatment on a negative type cutting insert W in which the rake faces 13 and the cutting edges 16 are formed on both of the top and the bottom faces.

Figure 5:
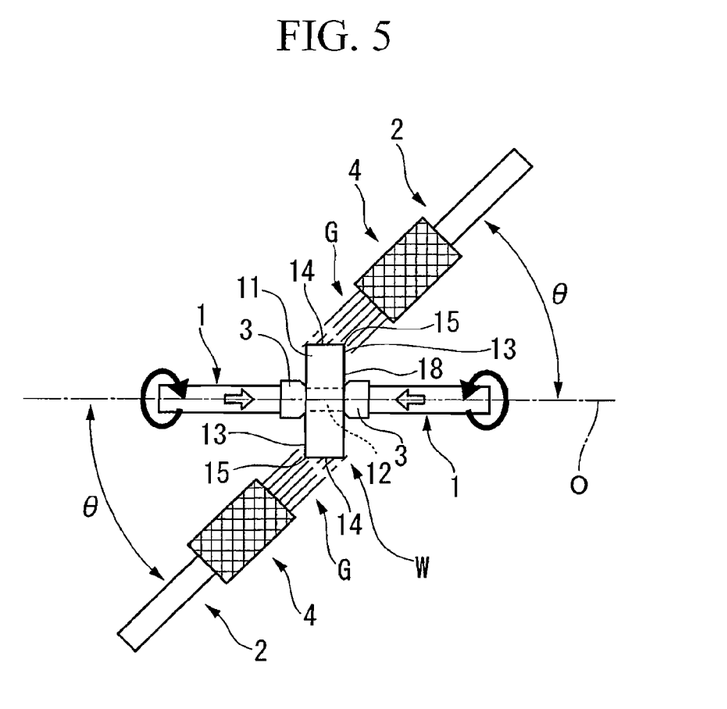
FIG. 5 is a diagram describing Embodiment 3 of the manufacturing method of the present invention.

In the manufacturing method of the present invention based on such a manufacturing equipment, the blasting gun 2 may also be arranged by adjusting the jetting angle θ so that it makes an acute angle of more than 0° and less than 90° with the axis O, like Embodiment 3 shown in FIG. 5 (45° in FIG. 5), in addition to the embodiments shown in FIG. 2 and FIG. 4. In this case, the intersecting edge line region 15, the flank face 14 of cutting insert W which crosses at this intersecting edge line region 15 and the rake face 13 which is formed on one polygonal face of the insert body 1 can be simultaneously treated, for example, by conforming the central line of jetting of the abrasive fluid G from a blasting gun 2 to the vicinity of the intersecting edge line region 15. Accordingly, like the above embodiment, the entire surface of the cutting insert W can be subjected to wet blasting treated simultaneously and more efficiently with the rotation of rotary shafts 1 by arranging a plurality of (two in this embodiment) blasting guns 2 such that they are located on opposite sides by interposing the axis O of the rotary shafts 1 and also located on opposite sides by interposing a portion between a pair of the rotary shafts 1 in the direction of the axis O, and the nozzles 4 are faced to the cutting insert W side, respectively.

Like these embodiments shown in FIG. 4 and FIG. 5, particularly, when the wet blasting is applied to the rake faces 13 of the cutting insert W, for example, there occurs a necessity that the coating layer 18 presenting a bright tone as described above reliably remains on the rake faces 13 and that the identification of the use or non-use of the cutting edges 16 by rubbing of chips is easily carried out. Accordingly, in such a case, in order to remain the coating layer 18 in prescribed portions without being affected by the wet blasting treatment, like Embodiment 4 shown in FIG. 6, masking members 5 for masking a portion of the surface of the cutting insert W to which the wet blasting treatment is not applied may be mounted in place of the above-described caps 3 to at least one of the pair of rotary shafts 1 (both in FIG. 6) which hold the surface-coated cutting insert W by clamping.

Here, these masking members 5 are similarly formed of a material with good adherence, like an elastic material made of a hard urethane rubber, as the caps 3 and are formed in conformity to the dimensions and shape of a portion where the coating layer 18 of the surface of the cutting insert W should be reliably remained without applying the wet blasting or a portion to which the wet blasting does not need to be applied as described above. In this embodiment, these masking members 5 are formed so as to mask inner side regions apart from the cutting edges 16 whose use or non-use by rubbing of chips is identifiable at only a prescribed distance in the rake faces 13 formed on the polygonal faces. Like the embodiment shown in FIG. 5, a plurality of (two) blasting guns 2 making an acute angle (45°) with the axis O are arranged such that their inclination angles θ are equal to each other, they are arranged on opposite sides by interposing the axis O of rotary shafts 1 and also on opposite sides in the direction of axis O by interposing a portion between the pair of rotary shafts 1, and the nozzles 4 are faced to the cutting insert W held by these rotary shafts 1.

Accordingly, the portions where the coating layer 18 should be remained are masked by the above-described masking members 5 and the wet blasting treatment is applied to only a portion of the surface of cutting insert W protruded from these masking members 5 by such an embodiment. Therefore, for example, the surface-coated cutting insert W formed with regions for identifying the use or non-use of the cutting edges 16 on the rake faces 13 as described above can be reliably manufactured. The masking members 5 are mounted to the tips of the rotary shafts 1 in this embodiment, therefore the masking may be made with good accuracy only by clamping the insert body 11 with the rotary shafts 1 and the operation is easy, even if the surface-coated cutting insert W applied with such a wet blasting treatment is mass produced, this embodiment enables to easily correspond thereto.

When the regions for identifying the use or non-use of the cutting edges 16 are thus formed, in the cutting insert W in the shape of a polygonal plate as described above, the corners of the polygonal faces, for example, only the corners 17 are frequently involved in the cutting operation as cutting edges 16 in the side edge portions of the polygonal faces, therefore the wet blasting treatment may also be applied in other portions without conducting the masking based on the masking member 5.

Figure 6:
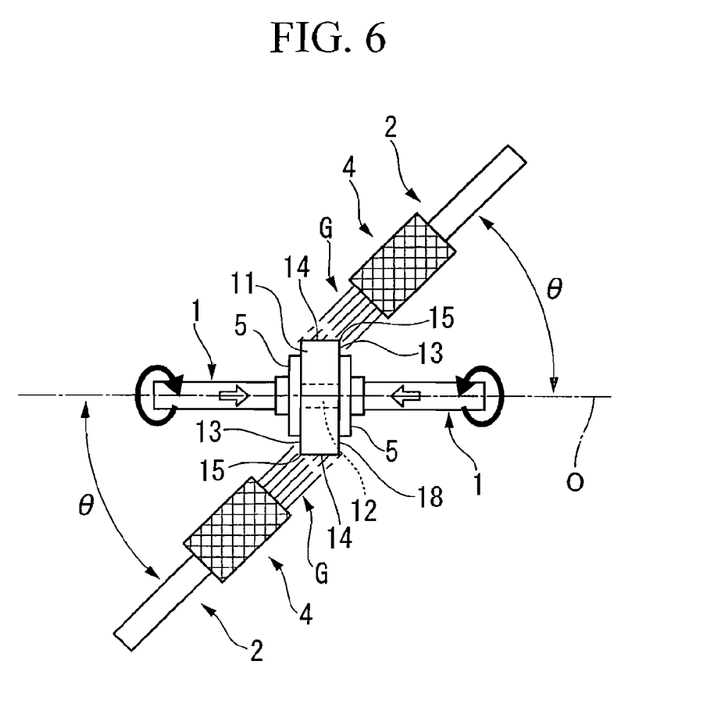
FIG. 6 is a diagram describing Embodiment 4 of the manufacturing method of the present invention.
Figure 7:
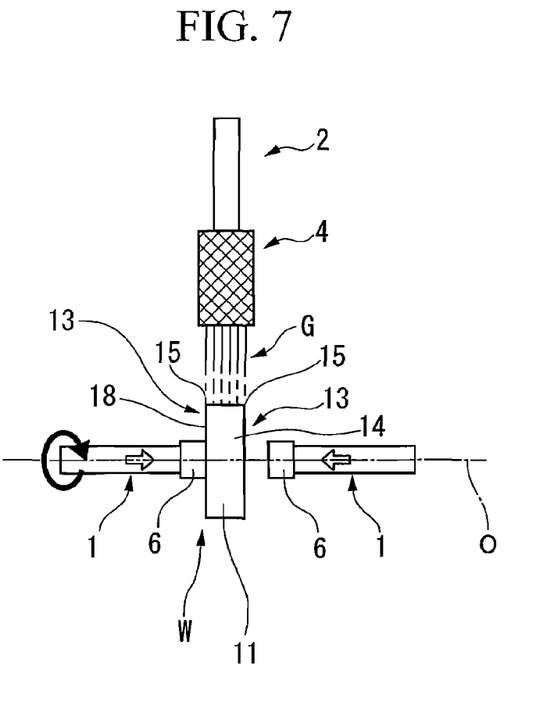
FIG. 7 is a diagram describing Embodiment 5 of the manufacturing method of the present invention.

In the manufacturing methods of the above-described embodiments, a case of applying the wet blasting treatment to the negative type surface-coated cutting insert W where the mounting hole 12 is formed in the insert body 11 was described. In order to applying the wet blasting treatment to a cutting insert W not provided with the mounting hole 12, for example, caps 6 made into a flat surface whose front end face is perpendicular to the axis O, like Embodiment 5 shown in FIG. 7, may be used in place of the above-described caps 3 whose front end is made to be tapered shown in FIG. 1 and the like. Of course, the front end faces of masking members 5 shown in FIG. 6 are similarly made into flat surfaces perpendicular to the axis O as the front end faces of these caps 6, and the wet blasting treatment may also be applied to a desirable range except for those masked by these masking members 5 in the insert body 11 free of the mounting hole 12.

Figure 8:
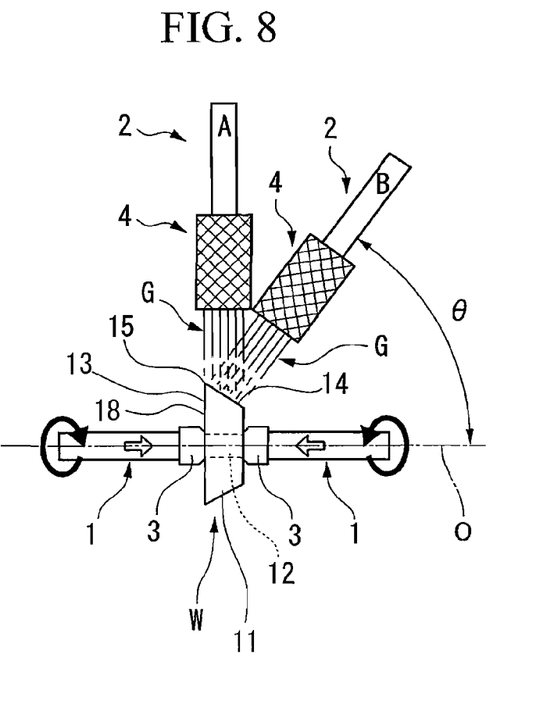
FIG. 8 is a diagram describing Embodiment 6 of the manufacturing method of the present invention.

When the wet blasting treatment is applied to the flank face 14 of an cutting insert (for example, positive type) W in which the rake faces 13 and the flank face 14 cross at an acute angle and a clearance angle is given to this flank face 14 (Embodiment 6), the jetting angle θ of an abrasive fluid G from the blasting gun 2 may be adopted at 90° to the axis O shown with a symbol A in FIG. 8 as similarly shown in FIG. 2, or the jetting angle θ may be an acute angle with the axis O by facing the blasting gun 2 to the side opposite to the rake face 13 as shown with a symbol B in FIG. 8, and may be selected to arrange the blasting guns 2 by selecting a posture of either symbol A or B.

In these cases, when the blasting gun 2 is positioned as shown with the symbol B, the jetting direction of the abrasive fluid G may be adjusted near to the direction perpendicular to this flank face 14 to achieve an efficient blast treatment by setting the jetting angle θ in accordance with the clearance angle given to the flank face 14. In such a positive type cutting insert W, the blasting guns 2 may be similarly arranged at an inclination angle of 0° or more and less than 90° to the axis O from the rake face 13 side as shown in FIGS. 4, 5 and 6, and the nozzles 4 may be faced to the rake face 13 side to jet the abrasive fluid G in order to apply the wet blasting treatment to the rake face 13.

Some preferred embodiments of the invention have been described above, although these embodiments are to be considered in all aspects as illustrative and not limitative. Those skilled in the art will appreciate that various conditions, omissions, substitutions and other modifications are possible without departing from the scope of the invention as disclosed in the accompanying claims. The present invention is not limited by the above-described explanation, but is limited only by the scope of the appended claims.

What is claimed is:

1. A method for removing a portion of a coating layer of a surface-coated cutting insert, the method comprising the steps of:
   forming at least one coating layer on a cutting insert for mounting to a mounting seat of an insert-removable machine tool;
   clamping and holding the surface-coated cutting insert with a pair of coaxial rotary shafts which are rotatable around an axis by a rotary drive device; and
   removing at least a portion of the outermost layer of the at least one coating layer by jetting an abrasive fluid to a surface of the surface-coated cutting insert using at least one blasting gun while rotating the surface-coated cutting insert integrally with the rotary shafts, thereby, conducting wet blasting with respect to a flank face, a rake face or both of a flank face and a rake face,
   wherein the jetting angle made by the jetting direction of the abrasive fluid from the blasting gun and the axis is adjustably set in accordance with the portion to which wet blasting is applied.

2. The method for removing the portion of the coating layer of the surface-coated cutting insert according to claim 1, wherein the surface-coated cutting insert is held with a pair of rotary shafts such that a rake face thereof is perpendicular to the axis and facing a direction of the axis.

3. The method for removing the portion of the coating layer of the surface-coated cutting insert according to claim 1, wherein the rotation of the rotary shafts is controlled while conducting the wet blasting by the blasting gun.

4. The method for removing the portion of the coating layer of the surface-coated cutting insert according to claim 3, wherein the rotational time and/or the rotational velocity of the rotary shafts are controlled while conducting the wet blasting by the blasting gun.

5. The method for removing the portion of the coating layer of the surface-coated cutting insert according to claim 3, wherein the rotation of the rotary shafts is stopped at one or a plurality of positions while the rotary shafts make one revolution around the axis.

6. The method for removing the portion of the coating layer of the surface-coated cutting insert according to claim 4, wherein the rotational velocity of the rotary shafts is changed in one or a plurality of the regions of rotation while the rotary shafts make one revolution around the axis.

7. The method for removing the portion of the coating layer of the surface-coated cutting insert according to claim 1, wherein while a masking member is mounted to at least one of the pair of the rotary shafts and the surface of the surface-coated cutting insert is masked, the wet blasting is conducted.

8. The method for removing the portion of the coating layer of the surface-coated cutting insert according to claim 1, wherein the wet blasting is conducted using a plurality of the blasting guns.

9. The method for removing the portion of the coating layer of the surface-coated cutting insert according to claim 8, wherein a plurality of the blasting guns are located on the opposite sides by interposing the axis of the rotary shafts, and the blasting guns are disposed such that the nozzles thereof face towards the surface-coated cutting insert which is held by the rotary shafts.

10. The method for removing the portion of the coating layer of the surface-coated cutting insert according to claim 8, wherein a plurality of the blasting guns are located on the opposite sides in the direction of the axis by interposing a portion of the rake face between the pair of rotary shafts.

11. The method for removing a portion of coating layer of a surface-coated cutting insert according to claim 1, wherein a substrate of the surface-coated cutting insert is tungsten carbide-based cemented carbide, titanium carbonitride-based cermet, or ceramics.

12. The method for removing the portion of the coating layer of the surface-coated cutting insert according to claim 1, wherein the coating layer includes at least one of a carbide, a nitride, an oxide or a boride of Al, Si and an element selected from Group IVa, Va, VIa metals of the periodic table of elements, and a composite compound thereof.

13. The method for removing the portion of the coating layer of the surface-coated cutting insert according to claim 1, wherein said cutting insert includes a pair of parallel polygonal faces and a plurality of lateral faces.

* * * * *